United States Patent
Kojima et al.

(10) Patent No.: US 8,195,411 B2
(45) Date of Patent: Jun. 5, 2012

(54) IDDQ TEST APPARATUS AND TEST METHOD

(75) Inventors: Shoji Kojima, Tokyo (JP); Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 616 days.

(21) Appl. No.: 12/391,210

(22) Filed: Feb. 23, 2009

(65) Prior Publication Data

US 2009/0222225 A1 Sep. 3, 2009

(30) Foreign Application Priority Data

Feb. 29, 2008 (JP) .................. 2008-049136

(51) Int. Cl.
*G01R 19/00* (2006.01)
*G01R 31/02* (2006.01)
*G01R 31/26* (2006.01)

(52) U.S. Cl. .................. 702/64; 324/762.01
(58) Field of Classification Search .............. 702/64; 324/762.01

See application file for complete search history.

(56) References Cited

U.S. PATENT DOCUMENTS

| | | | | |
|---|---|---|---|---|
| 5,944,847 A | * | 8/1999 | Sanada | 714/741 |
| 6,812,724 B2 | * | 11/2004 | Rao et al. | 324/762.03 |
| 6,873,171 B2 | * | 3/2005 | Reynick | 324/762.01 |
| 6,941,235 B2 | * | 9/2005 | Gattiker | 702/64 |

FOREIGN PATENT DOCUMENTS

| | | |
|---|---|---|
| JP | 08-304514 | 11/1996 |
| JP | 2008-002900 | 1/2008 |

* cited by examiner

*Primary Examiner* — Janet Suglo
(74) *Attorney, Agent, or Firm* — Martine Penilla Group, LLP

(57) ABSTRACT

Multiple non-defective samples of a DUT are selected. A quiescent power supply current (IDDQ) is measured for each of test vectors which are switched, for each of the non-defective samples. Statistical IDDQ values are measured in increments of the test vectors, and first array data is created including identifiers for the test vectors and the statistical IDDQs as elements. The first array data is sorted using the IDDQ value as a key so as to create second array data. The difference in quiescent power supply current is calculated by making difference between adjacent current elements of the second array data, so as to create third array data including the identifiers for the test vectors and the differences of current value as the elements. The third array data is sorted using the difference in current value as a key, and creates fourth array data.

22 Claims, 8 Drawing Sheets

IDDQ TEST APPARATUS AND TEST METHOD

CLAIM OF PRIORITY

The present application is claiming foreign priority of Japanese Patent Application No. 2008-049136, filed on Feb. 29, 2008, the content of which is incorporated herein by reference.

BACKGROUND OF THE INVENTION

1. Field of the Invention

The present invention relates to a test apparatus for a semiconductor apparatus (integrated circuit), and particularly to an IDDQ (Quiescent Vdd Supply Current) measurement technique.

2. Description of the Related Art

As a technique for assessing the quality of an LSI (Large Scale Integration), the IDDQ test is known. In the IDDQ test, a device under test (which will be abbreviate to "DUT" hereafter) is set to a quiescent state in which the electric potential and electric current are respectively set to fixed values at each of the circuit nodes of the DUT. In such a quiescent state, a quiescent power supply current (which will be abbreviated to the "IDDQ" hereafter) is measured.

In a normally manufactured CMOS (Complementary Metal Oxide Semiconductor) circuit, the drain current is substantially zero in the quiescent state in which the ON/OFF states of the transistors are respectively set to fixed states. Specifically, only a negligibly small amount of leak current flows. In other words, in a case in which a greater amount of leak current flows, such a leak current suggests that the circuit could have malfunctioning portions or defects due to the manufacturing process. Such a malfunctioning portion due to the manufacturing process, which increases the power supply current, affects the functions of the circuit, or affects the life and reliability of the circuit.

The value of the IDDQ changes according to the electric potential states of the nodes in the circuit. That is to say, the measurement value of the IDDQ changes according to the quiescent state of the circuit. Accordingly, in a measurement in which the IDDQ is measured in a single state, it is difficult to detect the malfunctioning portions or defects.

In order to solve such a problem, a technique has been proposed in which the states of nodes in the circuit are switched according to several pattern data items supplied to the DUT, and the IDDQ is measured in each state thus switched. The states to be switched are determined by a combination of multiple data items to be supplied to the DUT. Accordingly, each state is also referred to as a "test vector".

The IDDQ is measured for each test vector for each of multiple DUTs. The statistical value of the IDDQ is obtained for each test vector by statistically processing the measurement results. The statistical value thus obtained will also be referred to as an "expected value". By sorting the test vectors using each of the values of the IDDQ thus obtained as a key, an IDDQ profile for the product is created. In a test in the mass production process, the quality is assessed based upon the difference between the IDDQ profile of a DUT which is to be tested and the expected IDDQ profile (which will be referred to as the "expected profile").

[Patent Document 1]
Japanese Patent Application Laid Open No. 2008-002900
[Patent Document 2]
Japanese Patent Application Laid Open No. H08-304514

The aforementioned quality evaluation based upon the comparison result between the IDDQ profiles has the following problem. That is to say, in a case in which there is a large difference between the profile obtained by measurement and the expected profile due to variation in the process, in some cases, a product that should be assessed to be a non-defective product is assessed to be a defective product, or a product that should be assessed to be a defective product is assessed to be a non-defective product.

SUMMARY OF THE INVENTION

The present invention has been made in view of such a situation. It is a general purpose of the present invention to provide a high-precision IDDQ test method.

A test method according to an embodiment of the present invention includes: measuring a quiescent power supply current for each test vector switched among multiple test vectors, for each of multiple samples of a device under test; calculating a statistical quiescent power supply current for each test vector, and creating first array data including identifiers for the test vectors and the statistical quiescent power supply current values as elements; sorting the first array data using the quiescent power supply current value as a key so as to create second array data; calculating the difference in quiescent power supply current, which is obtained by calculating the differences between the adjacent quiescent power supply current elements of the second array data, so as to create third array data including the identifiers for the test vectors and the differences in current value as elements; and sorting the third array data using the difference in current value as a key so as to create fourth array data.

By creating array data using the difference in current, such an embodiment provides a test with high precision as compared with an arrangement using only array data including the test vector identifiers and the quiescent power supply current values as elements.

Also, the test method may further include: measuring a quiescent power supply current for each test vector switched among multiple test vectors, for a quality evaluation target device under test, so as to create fifth array data including the identifiers for the test vectors and the quiescent power supply current values as elements; sorting the fifth array data such that the order of the identifiers for the test vectors thereof matches the order of the identifiers for the test vectors included in the second array data, and creating sixth array data; calculating the difference in quiescent power supply current, which is obtained by calculating the differences between the adjacent quiescent power supply current elements of the sixth array data, so as to create seventh array data including the identifiers for the test vectors and the differences in current value as elements; sorting the seventh array data such that the order of the identifiers for the test vectors thereof matches the order of the identifiers for the test vectors included in the fourth array data; and assessing the quality of the quality evaluation target device under test, based upon the eighth array data.

By assessing the quality of a device under test based upon the eighth array data, such an arrangement improves the precision of the test.

Also, at least one of the first array data through the fourth array data may be modified using the quiescent power supply current values obtained in increments of test vectors for a device under test which has been assessed in the assessment to be non-defective.

Such an arrangement provides a test with the ability to track the variation of the manufacturing process.

Also, in the assessment, the eighth array data may be divided into multiple array data ranges, and quality evaluation may be made for each of the array data ranges thus divided, based upon the different conditions that correspond to the particular data array range.

Also, in the assessment, of the array data ranges obtained by dividing the eighth array data into two ranges, for the array data range in which the differences in current value are small, quality evaluation may be made by comparing each of the differences in current value with a predetermined fixed threshold.

Also, in the assessment, of the array data ranges obtained by dividing the eighth array data into two ranges, for the array data range in which the differences in current value are large, quality evaluation may be made by comparing each of the differences in current value with a threshold determined for the corresponding test vector.

Also, the thresholds determined for the respective test vectors may be set based upon the fourth array data.

Another embodiment of the present invention also relates to a test method. The test method includes: measuring a quiescent power supply current for each test vector switched among multiple test vectors, for a quality evaluation target device under test, so as to create fifth array data including the identifiers for the test vectors and the quiescent power supply current values as elements; sorting the fifth array data using the identifiers for the test vectors as a key so as to satisfy a predetermined first rule, and creating sixth array data; calculating the difference in quiescent power supply current, which is obtained by calculating the differences between the adjacent quiescent power supply current elements of the sixth array data, so as to create seventh array data including the identifiers for the test vectors and the differences in current value as elements; sorting the seventh array data using the identifiers for the test vectors as a key so as to satisfy a predetermined second rule, and creating eighth array data; and assessing the quality of the quality evaluation target device under test, based upon the eighth array data.

By creating array data using the difference in current, such an embodiment provides a test with high precision as compared with an arrangement using only array data including the test vector identifiers and the quiescent power supply current values as the elements.

With such an embodiment, the test method may further include creating a first rule. The creation of the first rule may include: measuring a quiescent power supply current for each test vector switched among multiple test vectors, for each of multiple samples of a device under test; calculating a statistical quiescent power supply current for each test vector, and creating first array data including identifiers for the test vectors and the statistical quiescent power supply current values as elements; sorting the first array data using the quiescent power supply current value as a key so as to create second array data; and setting the order of the identifiers for the test vectors included in the second array data as the first rule.

With such an embodiment, the test method may further include creating a second rule. The creation of the second rule may include: calculating the difference in quiescent power supply current, which is obtained by calculating the differences between the adjacent quiescent power supply current elements of the second array data, so as to create third array data including the identifiers for the test vectors and the differences in current value as elements; sorting the third array data using the difference in current value as a key so as to create fourth array data; and setting the order of the identifiers for the test vectors included in the fourth array data as the second rule.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In an embodiment described below, the quiescent power supply current (which will be referred to as the "IDDQ" hereafter) is measured for a device under test (which will be referred to as a "DUT" hereafter), and the quality of the DUT is assessed based upon the measurement result. The assessment processing, which is executed by the test apparatus based upon the IDDQ, is roughly classified into two processes.

In the first process, the IDDQ is measured for multiple DUT samples, and the expected value of the IDDQ, i.e., the condition based upon which the quality evaluation is made, is generated.

In the second process, the IDDQ is measured for a quality evaluation target DUT, and the quality of the DUT is assessed with reference to the condition generated in the first process.

Figure 1:
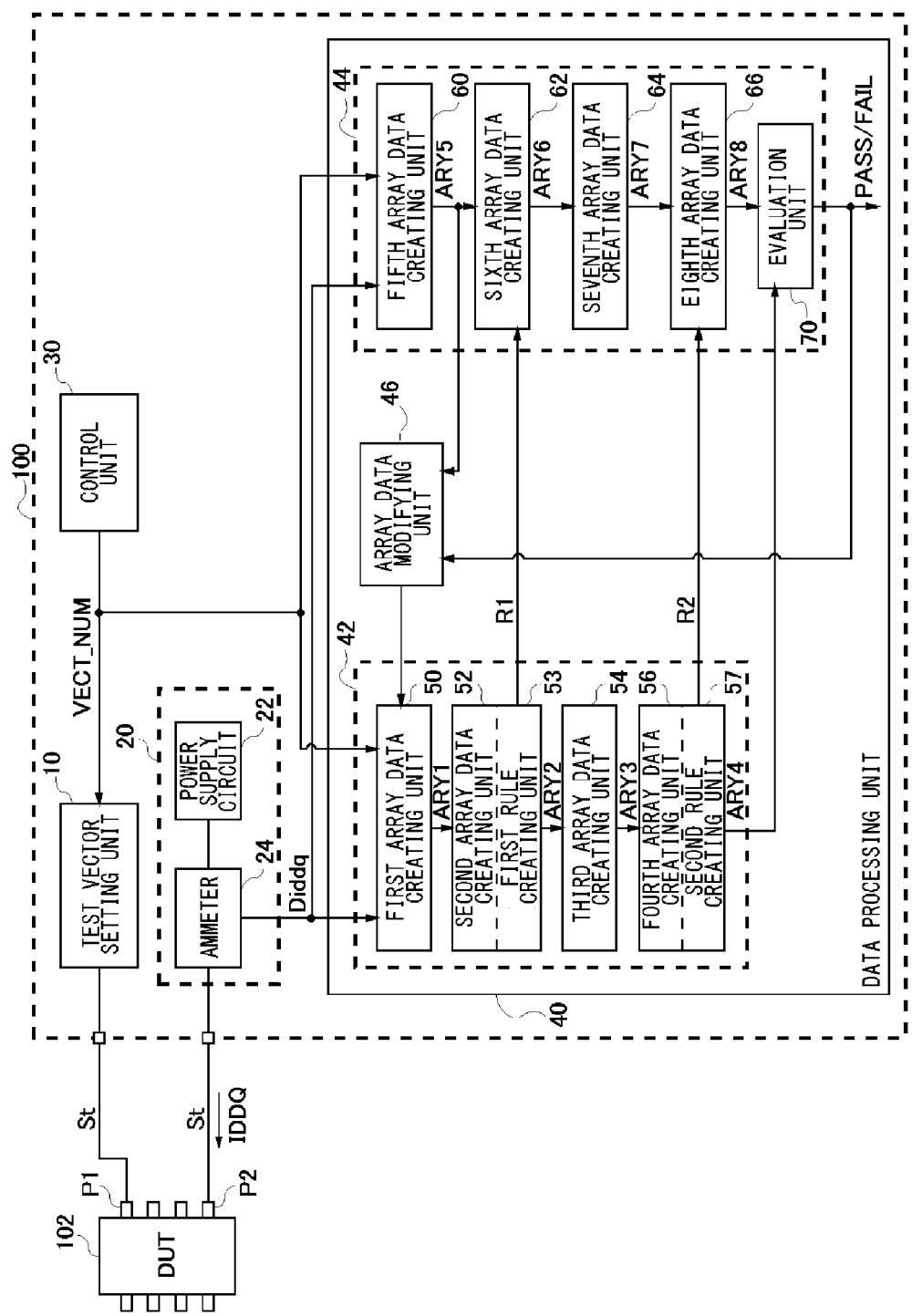
FIG. 1 is a block diagram which shows a configuration of a test apparatus according to an embodiment.

FIG. 1 is a block diagram which shows a test apparatus 100 according to an embodiment. The test apparatus 100 includes a test vector setting unit 10, a current measurement unit 20, a control unit 30, and a data processing unit 40.

Such components shown in the drawings in the form of functional blocks that provide various processing, e.g., the control unit 30 and the data processing unit 40 can be realized by hardware means, e.g., by actions of a CPU, memory, and other LSIs, or by software means, e.g., by actions of a program loaded into memory. Accordingly, such functional blocks can be realized by hardware components alone, software components alone, or various combinations thereof, which can be readily conceived by those skilled in this art. That is to say, each functional block is not restricted to hardware components alone or software components alone.

The test apparatus 100 switches the states of the nodes, each of which connects elements within a DUT 102, according to a certain number of supplied pattern data items. Next, the IDDQ is measured for each state (which will be referred to as a "test vector"). The switching operation for each state is determined by a combination of multiple data items supplied to the DUT. The test vector setting unit 10 switches the test vector among the multiple test vectors, and supplies a test signal St that corresponds to each test vector to the DUT 102 at each predetermined timing, e.g., at each clock timing. The test signal St is supplied to one or multiple control terminals P1 of the DUT 100.

The current measurement unit 20 supplies a predetermined power supply voltage Vdd to a power supply terminal P2 of the DUT 102, and measures the IDDQ for each test vector. The current measurement unit 20 includes a power supply circuit 22 and an ammeter 24. The power supply circuit 22 is a linear regulator or a switching regulator, for example. The ammeter 24 measures the IDDQ flowing from the power supply circuit 22 to the power supply terminal P2 of the DUT 102. The value of the IDDQ thus measured by the ammeter 24 is converted into a digital value, and is output to the data processing unit 40 as current data Diddq.

The control unit 30 centrally controls the overall operation of the test apparatus 100. Each test vector is managed in the test apparatus 100 using an identifier such as a number, character string, code, or the like. When the control unit 30 instructs the test vector setting unit 10 to switch the test vector, the control unit 30 outputs the identifier of the test vector to be set to the test vector setting unit 10. The identifier of the test vector will be referred to as the "test vector number VECT_NUM" hereafter. Furthermore, for facilitating understanding, in the following description, the test vector number VECT_NUM is represented in a decimal number format. The test vector setting unit 10 outputs the test data St, which corresponds to the test vector number VECT_NUM, to the DUT 102. The test vector number VECT_NUM is output to the data processing unit 40.

The data processing unit 40 includes a first block 42, a second block 44, and an array data modifying unit 46.

Of the components forming the data processing unit 40, the first block 42 executes the aforementioned first process. That is to say, the first block 42 measures the IDDQ for multiple samples, and calculates the expected value of the IDDQ.

Of the components forming the data processing unit 40, the second block 44 executes the aforementioned second process. That is to say, in the mass production process, the IDDQ is measured for the quality evaluation target DUT 102, and the quality of the DUT 102 is assessed by comparison with the expected value thus created in the first process.

First, description will be made regarding the first block 42. The first block 42 includes a first array data creating unit 50, a second array data creating unit 52, a third array data creating unit 54, and a fourth array data creating unit 56.

Figure 2:
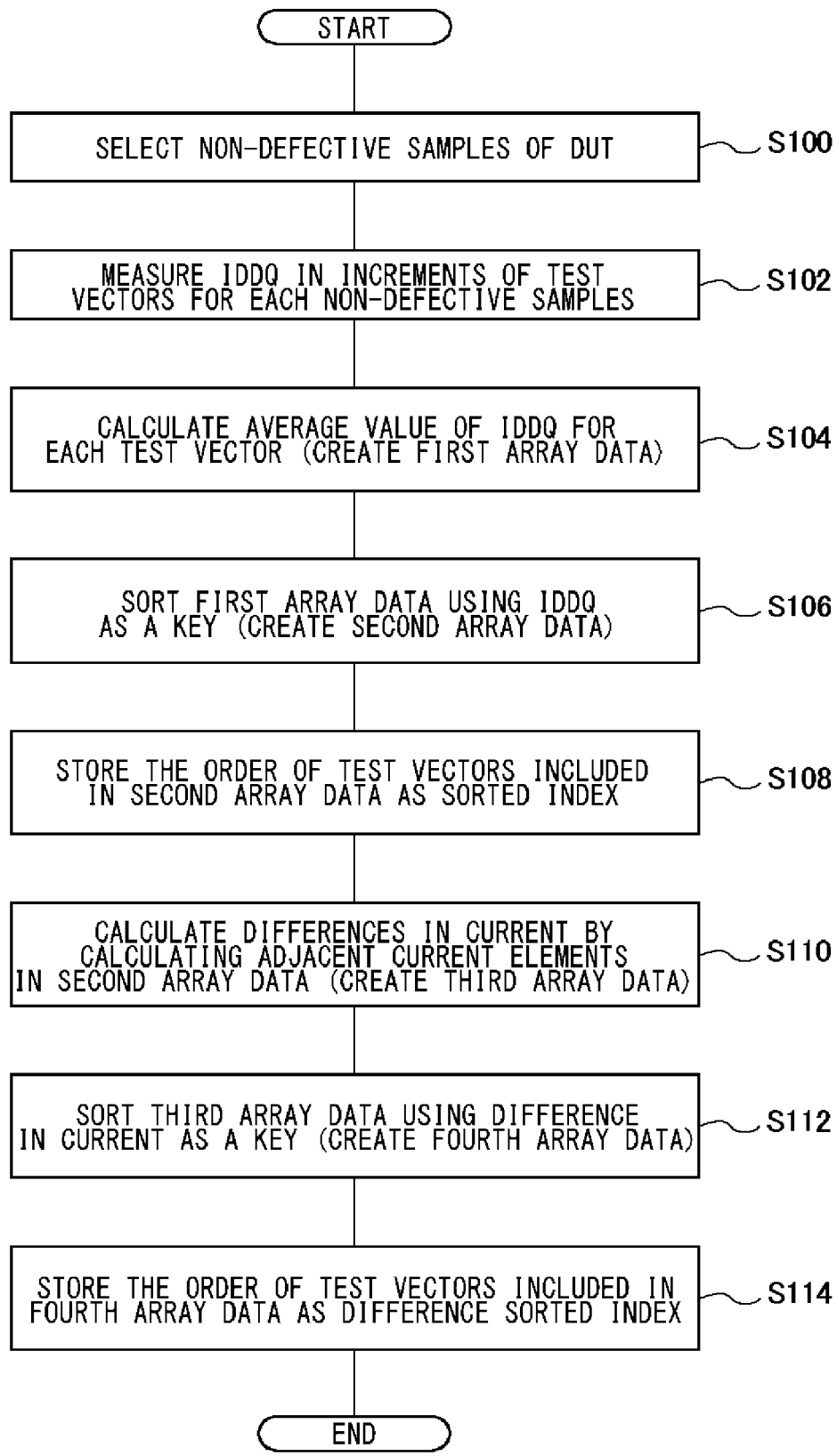
FIG. 2 is a flowchart which shows processing performed by a first block shown in FIG. 1.

FIG. 2 is a flowchart which shows the processing executed by the first block 42. First, before the processing by the first block 42, multiple DUTs 102 are tested based upon a predetermined evaluation test condition so as to select multiple non-defective samples (S100 in FIG. 2). The non-defective samples may be selected based upon the quality evaluation results obtained in a function test for the DUTs 102.

The test vector setting unit 10 and the current measurement unit 20 of the test apparatus 100 measure the IDDQ for each of the test vectors, which are switched among multiple test vectors, for each of the multiple non-defective samples (S102 in FIG. 2). The current data Diddq, which is the measurement result, is stored in a storage device (not shown) such as memory, a hard disk, or the like, included in the data processing unit 40.

The first array data creating unit 50 performs statistical processing on the IDDQ measured for the multiple non-defective samples of the DUT 102 in increments of test vectors with reference to the current data Diddq. In the simplest case, simple averaging is employed as the statistical processing. However, the statistical processing is not restricted to such an arrangement. Also, weighted averaging or other statistical methods may be employed. The statistical IDDQ will be referred to as the "average IDDQ" hereafter. The first array data creating unit 50 creates the first array data ARY1 including the test vector numbers VECT_NUM and the corresponding average IDDQs in the form of array elements (S104 in FIG. 2).

The second array data creating unit 52 sorts the first array data ARY1 using the average IDDQ as a key (S106 in FIG. 2). The array thus sorted will be referred to as the "second array data ARY2". A first rule creating unit 53 stores the order of the test vector numbers VECT_NUM of the second array data ARY2 as a first rule R1 (S108 in FIG. 2). The first rule R1 will also be referred to as the "sorted index SORT_INDEX".

The third array data creating unit 54 calculates the difference in current $\Delta IDDQ$, which is the difference between the adjacent IDDQ elements in the second array data ARY2, with reference to the second array data ARY2. Furthermore, the third array data creating unit 54 creates the third array data ARY3 including the test vector numbers VECT_NUM and the differences in current $\Delta IDDQ$ as elements (S110 in FIG. 2). The test vector numbers VECT_NUM stored in the third array data ARY3 match the sorted index SORT_INDEX.

For example, with the i'th (i represents an integer) element of the second array data ARY2 as $(VECT\_NUM_i, IDDQ_i)$, and with the adjacent, i.e., the (i+1)'th, element as $(VECT\_NUM_{i+1}, IDDQ_{i+1})$, the i'th element of the third array data ARY3 is represented by $(VECT\_NUM_i, \Delta IDDQ_i)$. Here, $\Delta IDDQ_i$ is represented by the following Expression:

$$\Delta IDDQ_i = IDDQ_{i+1} - IDDQ_i.$$

Seen from another perspective, the third array data ARY3 is obtained by calculating the differential of the second array data ARY2.

The fourth array data creating unit 56 sorts the third array data ARY3 using the difference in current $\Delta IDDQ$ as a key so as to create the fourth array data ARY4 (S112 in FIG. 2). A second rule creating unit 57 stores the order of the test vector numbers VECT_NUM in the fourth array data ARY4 as a second rule (S114 in FIG. 2). The second rule will also be referred to as the "difference sorted index DIF_SORT_INDEX".

The above-described is the configuration of the first block 42. Next, description will be made regarding the operation of the first block 42. FIGS. 3A through 3D show the first array data ARY1 through the fourth array data ARY4 created according to the flowchart shown in FIG. 2. The horizontal axis of each array represents the test vector number VECT_NUM, and the vertical axis thereof represents the IDDQ or the difference in current $\Delta IDDQ$.

Figure 3A:
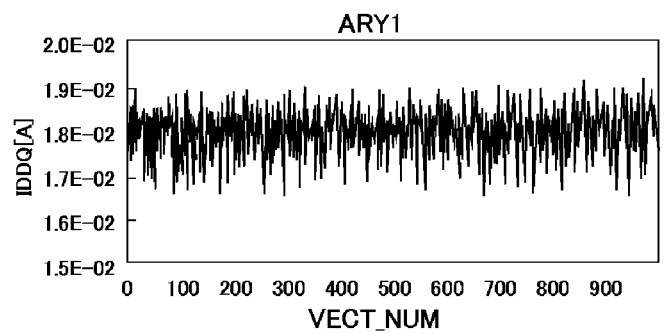
FIGS. 3A through 3D are diagrams which show first array data through fourth array data created according to the flowchart shown in FIG. 2.

FIG. 3A shows the first array data ARY1, which indicates the relation between the test vector number and the corresponding average IDDQ obtained for multiple samples. The current values and the test vector numbers, and the order thereof, are shown for exemplary purposes only.

Figure 3B:
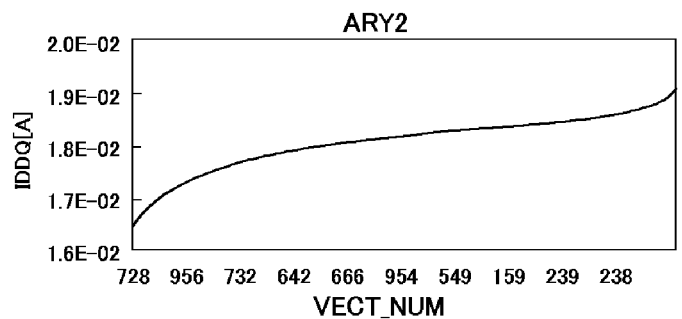

The second array data ARY2 shown in FIG. 3B is obtained by sorting the first array data ARY1 shown in FIG. 3A. The horizontal axis of the second array data ARY2 represents the sorted index SORT_INDEX stored as the first rule R1. That is to say, the sorted index SORT_INDEX is assumed to be a one-dimensional array including (728, . . . , 956, . . . , 732, . . . , 642, . . . , 666, . . . , 954, . . . , 549, . . . , 159, . . . , 239, . . . , 238, . . . ).

Figure 3C:
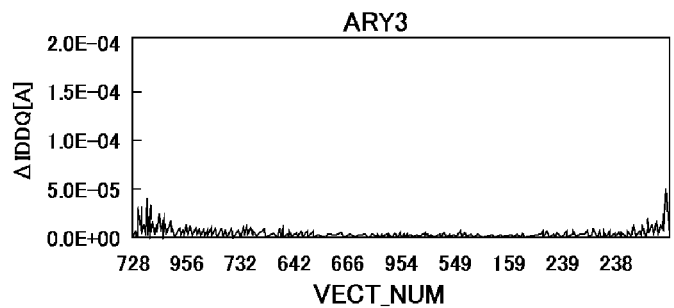

The third array data ARY3 shown in FIG. 3C is obtained by calculating the differential of the second array data ARY2 shown in FIG. 3B. The horizontal axis of the third array data ARY3 matches the horizontal axis of the second array data ARY2. It should be noted that the third array data ARY3 is created based upon the differences between the adjacent elements of the second array data ARY2. Accordingly, the number of elements in the third array data ARY3 is one smaller than that of the second array data ARY2.

Figure 3D:
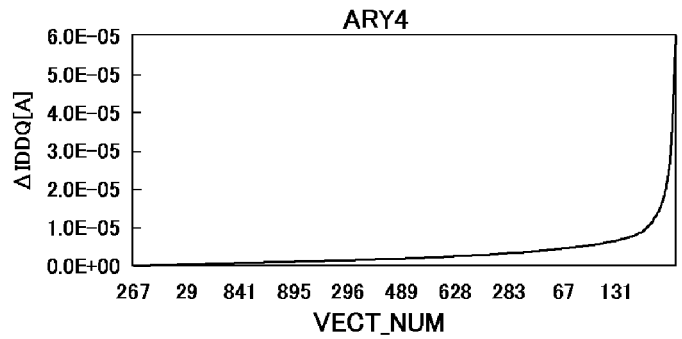

The fourth array data ARY4 shown in FIG. 3D is obtained by sorting the third array data ARY3 shown in FIG. 3C. The horizontal axis of the fourth array data ARY4 represents the difference sorted index DIF_SORT_INDEX stored as the second rule. That is to say, the difference sorted index DIF_SORT_INDEX is assumed to be a one-dimensional array including (267, . . . , 29, . . . , 841, . . . , 895, . . . , 296, . . . , 489, . . . , 628, . . . , 283, . . . , 67, . . . , 131, . . . ).

The above-described is the operation of the first block 42. The first block 42 creates various kinds of data necessary for making quality evaluation in the mass production process.

In the mass production process, the arrays that correspond to the array data shown in FIGS. 3A through 3D are created for each quality evaluation target DUT 102, using the sorted index SORT_INDEX and the difference sorted index DIF_SORT_INDEX.

Figure 4:
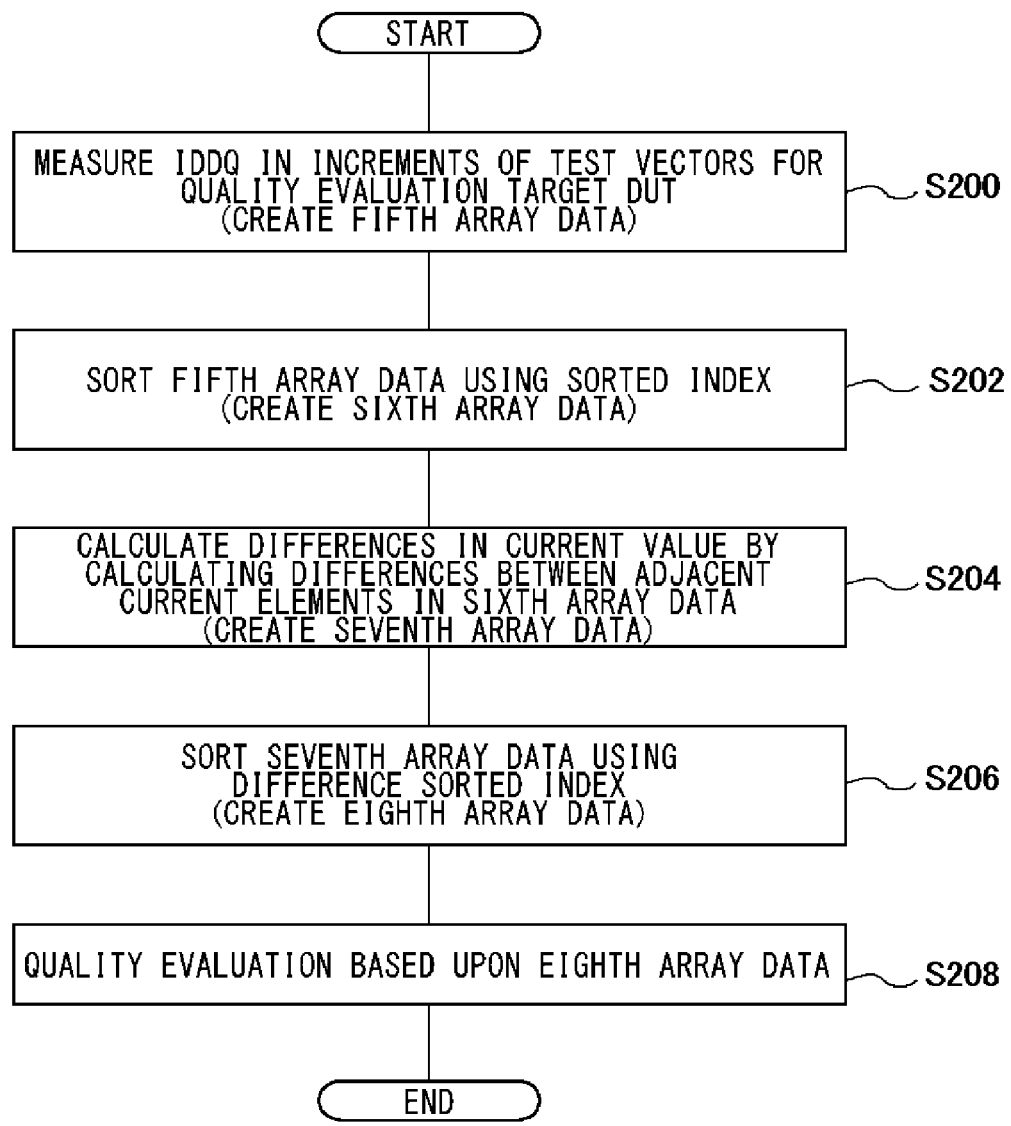
FIG. 4 is a flowchart which shows quality evaluation processing performed by a second block shown in FIG. 1.

Description will be made below regarding the configuration of the second block 44. The second block 44 includes a fifth array data creating unit 60, a sixth array data creating unit 62, a seventh array data creating unit 64, an eighth array data creating unit 66, and an evaluation unit 70. FIG. 4 is a flowchart which shows quality evaluation processing performed by the second block 44 shown in FIG. 1.

The test vector setting unit 10 and the current measurement unit 20 of the test apparatus 100 measure the IDDQ for each switched test vector, for the quality evaluation target DUT 102. The current data Diddq, which is the measurement result, is stored in a storage device (not shown) such as memory, a hard disk, or the like, included in the data processing unit 40.

The fifth array data creating unit 60 creates fifth array data ARY5 including the test vector numbers VECT_NUM and the corresponding IDDQs as elements (S200 in FIG. 4).

The sixth array data creating unit 62 creates sixth array data ARY6 by sorting the fifth array data ARY5 such that the order of the test vector numbers VECT_NUM thereof matches a predetermined first rule R1 (S202 in FIG. 4).

As the first rule R1, the sorted index SORT_INDEX, which has been obtained based upon multiple samples, is suitably employed. In this case, the sixth array data creating unit 62 sorts the fifth array data ARY5 such that the order of the test vector numbers VECT_NUM included in the fifth array data matches the order of the test vector numbers VECT_NUM in the second array data ARY2.

The seventh array data creating unit 64 calculates the difference in current ΔIDDQ, which is the difference between the adjacent IDDQ elements in the sixth array data ARY6, with reference to the sixth array data ARY6. Furthermore, the seventh array data creating unit 64 creates seventh array data ARY7 including the test vector numbers VECT_NUM and the differences in current ΔIDDQ as elements (S204 in FIG. 4). The test vector numbers VECT_NUM stored in the seventh array data ARY7 match the sorted index SORT_INDEX.

For example, with the i'th (i represents an integer) element of the sixth array data ARY6 as (VECT_NUM$_i$, IDDQ$_i$), and with the adjacent, i.e., the (i+1)'th, element as (VECT_NUM$_{i+1}$, IDDQ$_{i+1}$), the i'th element of the seventh array data ARY7 is represented by (VECT_NUM$_i$, ΔIDDQ$_i$). Here, ΔIDDQ$_i$ is represented by the following Expression: ΔIDDQ$_i$=|IDDQ$_{i+1}$−IDDQ$_i$|. Here, the symbol "| |" represents the absolute value operator.

Seen from another perspective, the seventh array data ARY7 is obtained by calculating the differential of the sixth array data ARY6.

The eighth array data creating unit 66 creates eighth array data ARY8 by sorting the seventh array data ARY7 such that the order of the test vector numbers VECT_NUM thereof matches a predetermined second rule R2 (S206).

As the second rule, the difference sorted index DIF_SORT_INDEX, which has been obtained based upon multiple samples, is suitably employed. In this case, the eighth array data creating unit 66 sorts the seventh array data ARY7 such that the order of the test vector numbers VECT_NUM thereof matches the order of the test vector numbers VECT_NUM included in the fourth array data ARY4.

The evaluation unit 70 evaluates the quality of the quality evaluation target DUT 102, based upon the eighth array data ARY8.

The above-described is the configuration of the second block 44. Next, description will be made regarding the operation of the second block 44. FIGS. 5A through 5D show the fifth array data ARY5 through the eighth array data ARY8 created according to the flowchart shown in FIG. 4. The horizontal axis of each array represents the test vector number VECT_NUM, and the vertical axis thereof represents the IDDQ or the difference in current ΔIDDQ.

Figure 5A:
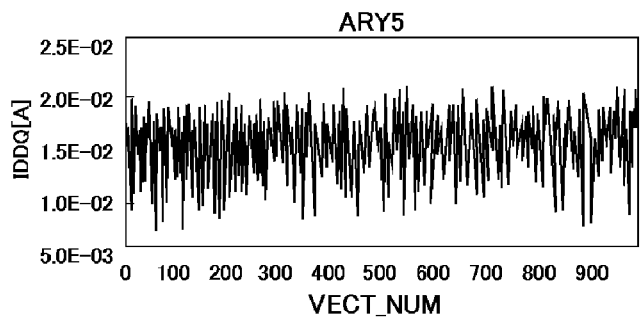
FIGS. 5A through 5D are diagrams which show fifth array data through eighth array data created according to the flowchart shown in FIG. 4.

FIG. 5A shows the fifth array data ARY5 obtained by measuring a given quality evaluation target DUT 102. The current values and the test vector numbers and order are shown for exemplary purposes only.

Figure 5B:
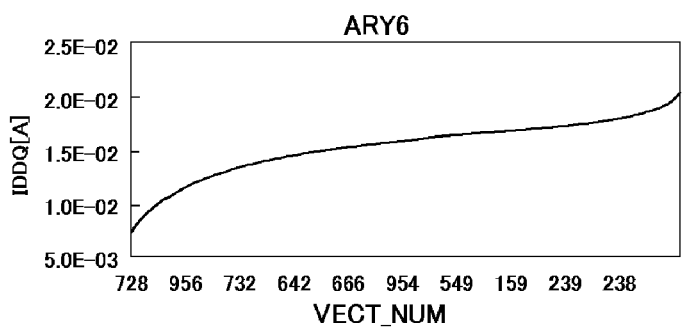

The sixth array data ARY6 shown in FIG. 5B is obtained by sorting the fifth array data ARY5 shown in FIG. 5A according to the first rule R1. The horizontal axis of the sixth array data ARY6 matches the sorted index SORT_INDEX stored as the first rule R1. That is to say, the horizontal axis of the sixth array data ARY6 matches the sorted index SORT_INDEX (728, . . . , 956, . . . , 732, . . . , 642, . . . , 666, . . . , 954, . . . , 549, . . . , 159, . . . , 239, . . . , 238, . . . ) used as the horizontal axis of the second array data ARY2.

Figure 5C:
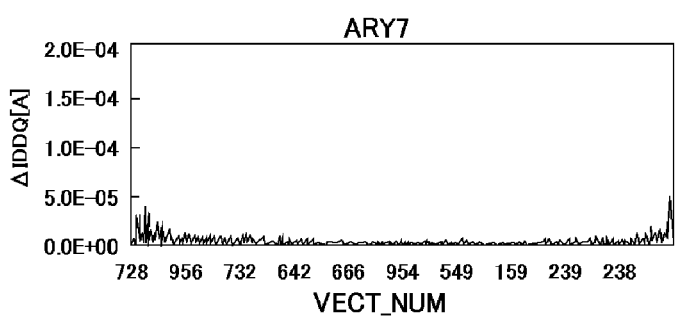

The seventh array data ARY7 shown in FIG. 5C is obtained by calculating the differential of the sixth array data ARY6 shown in FIG. 5B. The horizontal axis of the seventh array data ARY7 matches the horizontal axis of the sixth array data ARY6. It should be noted that the seventh array data ARY7 is created based upon the differences between the adjacent elements of the sixth array data ARY6. Accordingly, the number of elements in the seventh array data ARY7 is one smaller than that of the sixth array data ARY6.

Figure 5D:
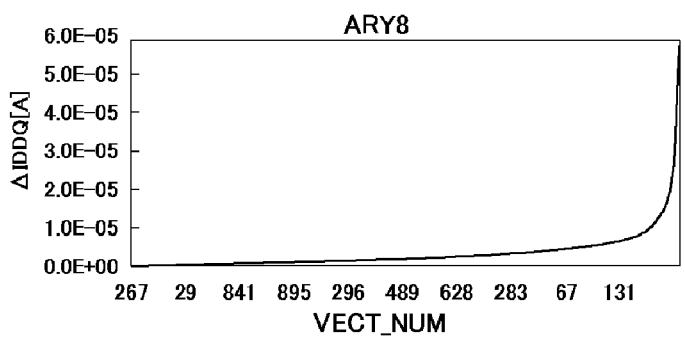

The eighth array data ARY8 shown in FIG. 5D is obtained by sorting the seventh array data ARY7 shown in FIG. 5C according to the second rule R2. The horizontal axis of the eighth array data ARY8 matches the difference sorted index DIFF_SORT_INDEX (267, . . . , 29, . . . , 841, . . . , 895, . . . , 296, . . . , 489, . . . , 628, . . . , 283, . . . , 67, . . . , 131, . . . ) stored as the second rule R2.

The test apparatus 100 assesses the quality of the DUT 102 based upon the eighth array data ARY8 shown in FIG. 5D. The above-described is the operation of the second block 44.

Next, description will be made regarding a quality evaluation method based upon the eighth array data ARY8.

In a simple quality evaluation method, the eighth array data ARY8 shown in FIG. 5D is compared with a threshold. For example, the threshold may be set by adding a predetermined margin to the difference in current ΔIDDQ stored in the fourth array data ARY4.

In a more suitable evaluation method, the eighth array data ARY8 is divided into multiple ranges, and quality evaluation is made for each of the ranges thus divided, based upon the different conditions that correspond to the particular range.

For example, the eighth array data ARY8 is divided into a range in which the difference in current ΔIDDQ is relatively small and a range in which the difference in current ΔIDDQ is relatively large. Hereafter, the former range will be referred to as the "array data ARY8$a$", and the latter range will be referred to as the "array data ARY8$b$".

Figure 6:
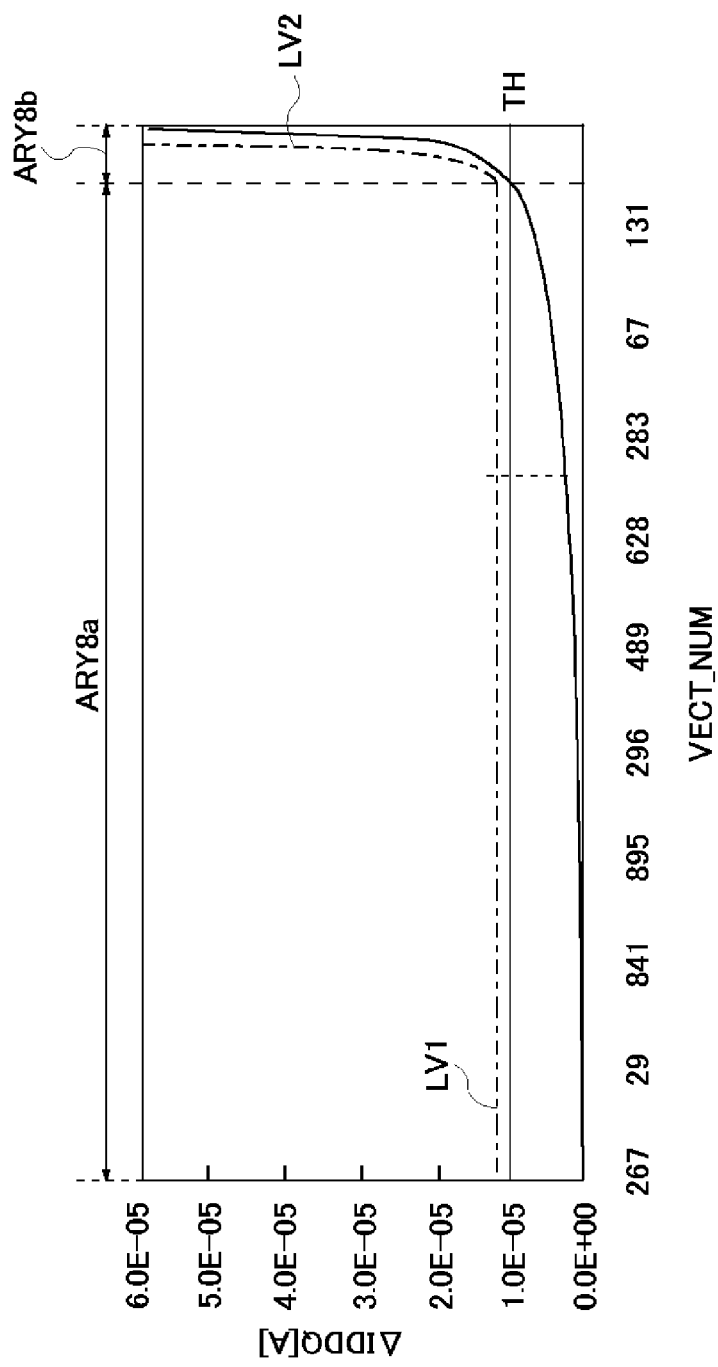
FIG. 6 is a diagram which shows a method for making quality evaluation based upon the eighth array data.

FIG. 6 is a diagram which shows a method for making quality evaluation based upon the eighth array data ARY8. The eighth array data ARY8 is divided, with a given threshold TH as the boundary, into the array data ARY8$a$ and ARY8$b$.

The boundary threshold TH may be set with respect to the difference in current ΔIDDQ. In this case, the range in which the difference in current ΔIDDQ is smaller than the boundary threshold level TH is set to be the array data ARY8$a$, and the range in which the difference in current ΔIDDQ is larger than the boundary threshold level TH is set to be the array data ARY8$b$.

Also, an arrangement may be made in which, of the elements in the eighth array data ARY8, the first N elements, which correspond to small differences in current ΔIDDQ, are set to be the array data ARY8$a$, and the other elements are set to be the array data ARY8$b$.

Description will be made regarding an evaluation method for each range. For the array data ARY8$a$ in which the difference in current ΔIDDQ is small, the difference in current ΔIDDQ is compared for each test vector with a predetermined fixed threshold level LV1 indicated by the alternately long and short dashed lines. As a result of the comparison, in a case in which the difference in current ΔIDDQ is greater than the fixed threshold level LV1 as indicated by the broken line, assessment is made that the DUT 102 is defective.

The threshold level LV1 may be determined according to the user's input. Also, the threshold level V1 may be obtained by calculation based upon the value of the fourth array data ARY4.

With respect to the array data ARY8$b$, in which the difference in current ΔIDDQ is large, each difference in current ΔIDDQ is compared with a threshold LV2 determined for the corresponding test vector number VECT_NUM. The threshold LV2 is also indicated by the alternately long and short dashed lines. The threshold LV2 may be determined based upon the fourth array data ARY4. For example, the threshold LV2 may be set by adding a predetermined margin to the difference in current ΔIDDQ for each of the test vector numbers stored in the fourth array data ARY4.

It should be noted that FIG. 6 shows an arrangement in which the threshold level LV2 equals the boundary threshold level TH at the boundary between the array data ARY8$a$ and ARY8$b$. Also, an arrangement may be made in which the threshold level LV2 and the boundary threshold level TH are set to different levels.

By dividing the range, and by setting evaluation conditions for each range thus divided, such an arrangement prevents the occurrence of erroneous defective/non-defective evaluation.

The evaluation unit 70 may perform additional processing as follows.

As shown in FIG. 5B, the sixth array data ARY6 typically has an S-curve profile. The S-curve profile changes due to variation in the process. FIGS. 7A through 7D are diagrams which show the change in the array data due to variation in the process and the associated correction method.

Figure 7A:
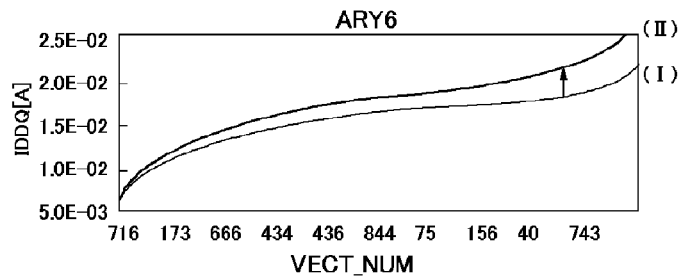
FIGS. 7A through 7D are diagrams which show the change in each array data due to the process variation and an associated correction method.

FIG. 7A shows the change in the sixth array data ARY6 due to variation in the process. For example, in the initial state, the profile of the sixth array data ARY6 indicated by (I) changes to the profile shown by (II) due to process variation. For example, the change in the S-shaped profile is represented by the change in the slope of the S-curve.

Figure 7B:
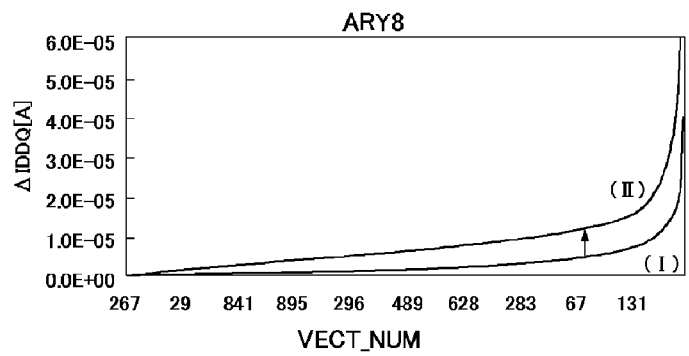

The change in the slope of the sixth array data ARY6 is represented by the change in the absolute value of the eighth array data ARY8. This is because the eighth array data ARY8 is obtained as a result of calculating the differential of the sixth array data ARY6. FIG. 7B shows the change in the eighth array data ARY8 due to process variation.

An overall or uniform rise or drop that occurs in the eighth array data ARY8 only means that there is a change in leak current due to process variation. In a case in which the above-described evaluation processing is performed without any modification on the eighth array data ARY8 in which such an overall shift has occurred, in some cases, a DUT which should be evaluated to be non-defective is erroneously assessed to be defective.

In order to prevent the occurrence of such an erroneous assessment due to variation in the process, it is effective to correct at least one of the array data ARY5 through ARY8. Description will be made below regarding several correction methods as examples.

(First Correction Method)

Figure 7C:
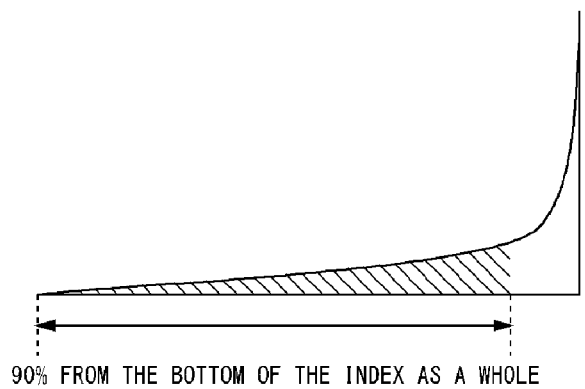

The evaluation unit 70 corrects the eighth array data ARY8. FIG. 7C shows the correction of the eighth array data ARY8. The correction of the eighth array data ARY8 is made by normalizing the eighth array data ARY8 by multiplying the eighth array data ARY8 by a coefficient such that the area of the hatched region is maintained at a constant value. The hatched region may be set by the number of test vectors, e.g., 90% of the sorted index SORT_INDEX as a whole.

Also, an arrangement may be made in which the eighth array data ARY8 is multiplied by a coefficient such that the difference in current ΔIDDQ that corresponds to a predetermined test vector number VECT_NUM is maintained at a constant value.

(Second Correction Method)

Figure 7D:
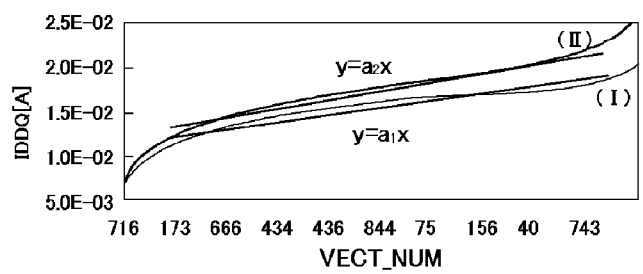

The sixth array data creating unit 62 corrects the sixth array data ARY6. FIG. 7D shows the correction of the sixth array data ARY6. The correction of the sixth array data ARY6 is made such that the slope of the S-shaped profile is maintained at a constant value. For example, an arrangement may be made in which the sixth array data ARY6 is approximated by a regression line, and correction is made such that the slopes a1 and a2 match a reference value. Also, an arrangement may be made in which the sixth array data ARY6 is polynomial-expanded by regression analysis, and the coefficient of the first term is substituted for the reference value. Such correction prevents the occurrence of erroneous assessments due to variation in the process.

As described above, the evaluation unit 70 assesses the quality of the DUT 102 to be assessed.

Furthermore, in order to track the process variation, the following technique may be employed. Returning to FIG. 1, the data processing unit 40 includes an array data modifying unit 46, in addition to the first block 42 and the second block 44. The array data modifying unit 46 receives, as the input data, the fifth array data ARY5 and the quality evaluation result for the quality evaluation target DUT 102.

In a case in which assessment has been made that the DUT 102 is non-defective, the array data modifying unit 46 modifies at least one of the first array data ARYT through the fourth array data ARY4 using the fifth array data ARY5, i.e., using the values of IDDQs obtained in increments of test vectors.

For example, in an embodiment, the array data modifying unit 46 modifies the first array data ARY1. That is to say, the array data modifying unit 46 updates the values of the average IDDQs, which have been obtained by statistical processing, using the IDDQs measured for the DUT that has been assessed to be non-defective. The first array data ARY1 may be modified by performing statistical processing in a first-in/first-out manner on the latest N samples which have been assessed to be non-defective. Also, the first array data ARY1 may be updated by applying the weighted latest fifth array data to the past accumulative first array data ARY1.

The second array data creating unit 52, the third array data creating unit 54, and the fourth array data creating unit 56 update the second array data ARY2 through the fourth array data ARY4 with reference to the modified first array data ARY1. As a result, the sorted index SORT_INDEX, which is the first rule R1, and the difference sorted index DIF_SORT_INDEX, which is the second rule R2, are updated.

A modification may be made in which the third array data ARY3 is modified using the seventh array data ARY7 measured for DUTs which have been assessed to be non-defective.

In a case in which products of the same type are manufactured over multiple lots or over a long period of time, the value of the IDDQ which should be assessed to be non-defective changes due to process variation over short and long periods of time. That is to say, the profiles of the fifth array data ARY5 through the eighth array data ARY8 change due to process variation. The change in the profile due to process variation leads to erroneous quality evaluation. In order to solve this problem, the array data modifying unit 46 updates at least one of the first array data ARY1 through the fourth array data ARY4. From another perspective, the array data modifying unit 46 updates at least one of the sorted index SORT_INDEX and the difference sorted index DIF_SORT_INDEX. Thus, such an arrangement provides an IDDQ test which is capable of tracking the process variation.

At a manufacturing site for semiconductor devices, in some cases, multiple test apparatuses 100 are employed, and devices of the same type are tested at the same time. In such a case, an arrangement may be made in which the multiple test apparatuses 100 are networked, and acquire/modify the first array data ARY1 through the fourth array data ARY4 in cooperation with one another.

Figure 8:
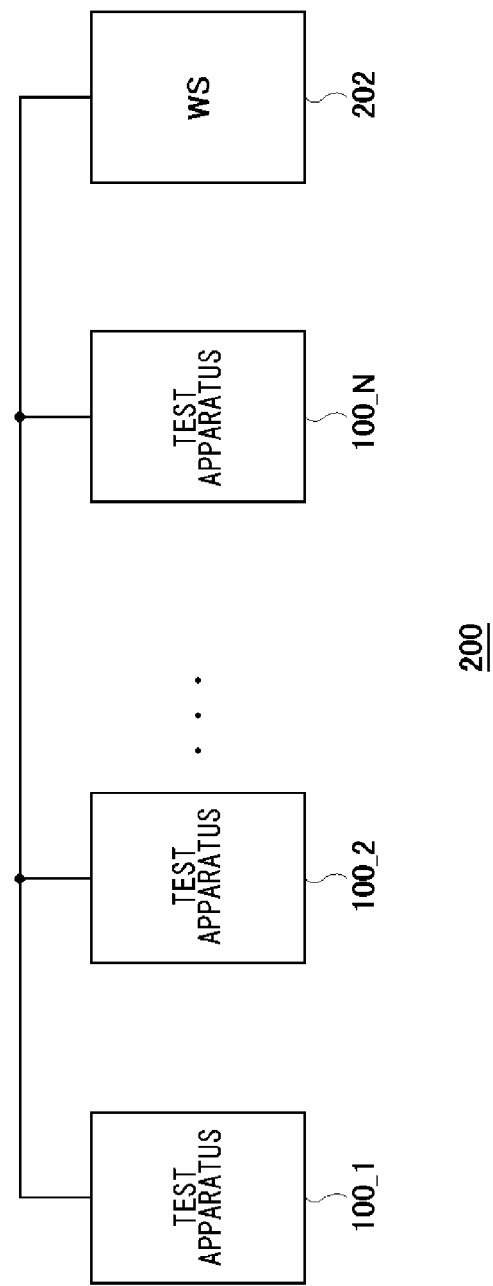
FIG. 8 is a block diagram which shows a configuration of a test system including multiple test apparatuses which are networked.

FIG. 8 is a block diagram which shows a test system 200 including networked multiple test apparatuses 100. The test system 200 includes N (N is an integer of 2 or more) test apparatuses 100_1 to 100_N and a workstation 202. The test apparatuses 100_1 to 100_N and the workstation 202 are connected via a network. Each test apparatus 100 measures the IDDQ for a DUT independently or synchronously with the other test apparatuses. The workstation 202 accumulates and aggregates the IDDQ values measured by the test apparatuses 100, and creates the first array data ARY1 through the eighth array data ARY8. That is to say, the function of the data processing unit 40 shown in FIG. 1 is provided by a component external to the test apparatuses 100.

A modification may be made in which, instead of providing the workstation 202, the multiple test apparatuses 100_1 through 100_N exchange their information, and each of the test apparatuses 100 manages the first array data ARY1 through the eighth array data ARY8. In this case, an arrangement may be made in which one of the multiple test apparatuses 100 operates as a master apparatus, and the other test apparatuses 100 operate as slave apparatuses. Also, all the test apparatuses may operate on equal terms, instead of employing a master/slave system.

With such arrangements, the test system 200 provides an effective test.

Description has been made regarding the configuration and the operation of the test apparatus 100. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiments regarding an arrangement in which the data processing unit 40 of the test apparatus 100 includes the first block 42 and the second block 44. However, the present invention is not restricted to such an arrangement. For example, the test apparatus 100 may include only the first block 42, and may create the first rule R1, the second rule R2, the fourth array data ARY4, etc., which are used in a subsequent test in the mass production process. Also, the test apparatus 100 may include only the second block 44, and may test a DUT based upon the first rule R1, the second rule R2, the fourth array data ARY4, etc., given by external sources. For example, in a case in which the first rule R1, the second rule R2, and the fourth array data ARY4 can be estimated by simulation, the test apparatus 100 may test the DUT using the simulation results.

While the preferred embodiments of the present invention have been described using specific terms, such description is for illustrative purposes only, and it is to be understood that changes and variations may be made without departing from the spirit or scope of the appended claims.

What is claimed is:

1. A test method including:
   measuring a quiescent power supply current for each test vector switched among a plurality of test vectors, for each of a plurality of samples of a device under test;
   calculating a statistical quiescent power supply current for each test vector, and creating first array data including identifiers for the test vectors and the statistical quiescent power supply current values as elements;
   sorting the first array data using the statistical quiescent power supply current value as a key so as to create second array data;
   calculating the difference in statistical quiescent power supply current, which is obtained by calculating the differences between the adjacent statistical quiescent power supply current elements of the second array data, so as to create third array data including the identifiers for the test vectors and the differences in current value as elements; and
   sorting the third array data using the difference in current value as a key so as to create fourth array data, wherein the test method further comprises,
   measuring a quiescent power supply current for each test vector switched among a plurality of test vectors, for a quality evaluation target device under test, so as to create fifth array data including the identifiers for the test vectors and the quiescent power supply current values as elements;

sorting the fifth array data such that the order of the identifiers for the test vectors thereof matches the order of the identifiers for the test vectors included in the second array data thereby creating sixth array data;

calculating the difference in quiescent power supply current, which is obtained by calculating the differences between the adjacent quiescent power supply current elements of the sixth array data, so as to create seventh array data including the identifiers for the test vectors and the differences in current value as elements;

sorting the seventh array data such that the order of the identifiers for the test vectors thereof matches the order of the identifiers for the test vectors included in the fourth array data; and assessing the quality of the quality evaluation target device under test, based upon the eighth array data.

2. A test method according to claim 1, wherein at least one of the first array data through the fourth array data is modified using the quiescent power supply current values obtained in increments of test vectors for a device under test which has been assessed to be non-defective.

3. A test method according to claim 1, wherein, in the assessment, the eighth array data is corrected according to a predetermined rule, and quality evaluation is made based upon the array data thus corrected.

4. A test method according to claim 1, further including correcting the sixth array data according to a predetermined rule.

5. A test method according to claim 1, wherein, in the assessment, the eighth array data is divided into a plurality of array data ranges, and quality evaluation is made for each of the array data ranges thus divided, based upon the different conditions that correspond to the particular data array range.

6. A test method according to claim 5, wherein, in the assessment, of the array data ranges obtained by dividing the eighth array data into two ranges, for the array data range in which the differences in current value are small, quality evaluation is made by comparing each of the differences in current value with a predetermined fixed threshold.

7. A test method according to claim 5, wherein, in the assessment, of the array data ranges obtained by dividing the eighth array data into two ranges, for the array data range in which the differences in current value are large, quality evaluation is made by comparing each of the differences in current value with a threshold determined for the corresponding test vector.

8. A test method according to claim 7, wherein the thresholds determined for the respective test vectors are set based upon the fourth array data.

9. A test apparatus which measures a quiescent power supply current in a device under test including:

a test vector setting unit which switches a plurality of test vectors, and supplies a test signal that corresponds to each test vector to the device under test;

a current measurement unit which measures a quiescent power supply current in the device under test for each test vector;

a first array data creating unit which performs statistical processing on the quiescent power supply current values measured in increments of test vectors for a plurality of samples of the device under test, and creates first array data including identifiers for the test vectors and the statistical quiescent power supply current values as elements;

a second array data creating unit which sorts the first array data using the statistical quiescent power supply current value as a key so as to create second array data;

a third array data creating unit which calculates the difference in statistical quiescent power supply current, which is obtained by calculating the differences between the adjacent statistical quiescent power supply current elements of the second array data, so as to create third array data, including the identifiers for the test vectors and the difference in current value as elements; and a fourth array data creating unit which sorts the third array data using the difference in current value as a key so as to create fourth array data, wherein the test vector setting unit supplies the test signals that correspond to the plurality of test vectors to a quality evaluation target device under test, and wherein the current measurement unit measures a quiescent power supply current in the device under test to be quality assessed, for each test vector, and wherein the test apparatus further includes, a fifth array data creating unit which creates fifth array data including the identifiers for the plurality of test vectors and the quiescent power supply current values as elements;

a sixth array data creating unit which sorts the fifth array data such that the order of the identifiers for the test vectors thereof matches the order of the identifiers for the test vectors included in the second array data so as to create sixth array data;

a seventh array data creating unit which calculates the difference in quiescent power supply current, which is obtained by calculating the differences between the adjacent quiescent power supply current elements of the sixth array data, so as to create seventh array data including the identifiers for the test vectors and the differences in current value as elements; and an eighth array data creating unit which sorts the seventh array data such that the order of the identifiers for the test vectors thereof matches the order of the identifiers for the test vectors included in the fourth array data so as to create eighth array data; and an evaluation unit which assesses the quality of the device under test which is to be quality assessed based upon the eighth array data.

10. A test apparatus according to claim 9, further including an array data modifying unit which corrects at least one of the first array data through the fourth array data using the quiescent power supply current values measured in increments of test vectors for a device under test which has been assessed to be non-defective.

11. A test apparatus according claim 9, wherein the evaluation unit corrects the eighth array data according to a predetermined rule, and makes quality evaluation based upon the array data thus corrected.

12. A test apparatus according claim 9, wherein the sixth array data creating unit corrects the sixth array data according to a predetermined rule, and wherein the seventh array data creating unit creates the seventh array data based upon the sixth array data thus corrected.

13. A test system including a plurality of test apparatuses according to claim 9, wherein the test apparatuses are networked.

14. A test method including:

measuring a quiescent power supply current for each test vector switched among a plurality of test vectors, for a quality evaluation target device under test, so as to create fifth array data including the identifiers for the test vectors and the quiescent power supply current values as elements;

sorting the fifth array data using the identifiers for the test vectors as a key so as to satisfy a predetermined first rule thereby creating sixth array data;

calculating the difference in quiescent power supply current, which is obtained by calculating the differences between the adjacent quiescent power supply current elements of the sixth array data, so as to create seventh array data including the identifiers for the test vectors and the differences in current value as elements;

sorting the seventh array data using the identifiers for the test vectors as a key so as to satisfy a predetermined second rule thereby creating eighth array data; and assessing the quality of the quality evaluation target device under test, based upon the eighth array data, wherein, in the assessment, the eighth array data is corrected according to a predetermined rule, and quality evaluation is made based upon the array data thus corrected.

15. A test method including:

measuring a quiescent power supply current for each test vector switched among a plurality of test vectors, for a quality evaluation target device under test, so as to create fifth array data including the identifiers for the test vectors and the quiescent power supply current values as elements;

sorting the fifth array data using the identifiers for the test vectors as a key so as to satisfy a predetermined first rule thereby creating sixth array data;

calculating the difference in quiescent power supply current, which is obtained by calculating the differences between the adjacent quiescent power supply current elements of the sixth array data, so as to create seventh array data including the identifiers for the test vectors and the differences in current value as elements;

sorting the seventh array data using the identifiers for the test vectors as a key so as to satisfy a predetermined second rule thereby creating eighth array data; and assessing the quality of the quality evaluation target device under test, based upon the eighth array data, wherein the test method further comprises correcting the sixth array data according to a predetermined rule.

16. A test method including:

measuring a quiescent power supply current for each test vector switched among a plurality of test vectors, for a quality evaluation target device under test, so as to create fifth array data including the identifiers for the test vectors and the quiescent power supply current values as elements;

sorting the fifth array data using the identifiers for the test vectors as a key so as to satisfy a predetermined first rule thereby creating sixth array data;

calculating the difference in quiescent power supply current, which is obtained by calculating the differences between the adjacent quiescent power supply current elements of the sixth array data, so as to create seventh array data including the identifiers for the test vectors and the differences in current value as elements;

sorting the seventh array data using the identifiers for the test vectors as a key so as to satisfy a predetermined second rule thereby creating eighth array data assessing the quality of the quality evaluation target device under test, based upon the eighth array data; and creating the first rule, wherein the creation of the first rule includes, measuring a quiescent power supply current for each test vector switched among a plurality of test vectors, for each of a plurality of samples of a device under test;

calculating a statistical quiescent power supply current for each test vector, and creating first array data including identifiers for the test vectors and the statistical quiescent power supply current values as elements;

sorting the first array data using the statistical quiescent power supply current value as a key so as to create second array data; and setting the order of the identifiers for the test vectors included in the second array data as the first rule.

17. A test method according to claim 16, further including creating the second rule, wherein the creation of the second rule includes:

calculating the difference in statistical quiescent power supply current, which is obtained by calculating the differences between the adjacent statistical quiescent power supply current elements of the second array data, so as to create third array data including the identifiers for the test vectors and the differences in current value as elements;

sorting the third array data using the difference in current value as a key so as to create fourth array data; and setting the order of the identifiers for the test vectors included in the fourth array data as the second rule.

18. A test apparatus which measures a quiescent power supply current in a quality evaluation target device under test, and assesses the quality of the device under test, including:

a test vector setting unit which switches a plurality of test vectors, and supplies a test signal that corresponds to each test vector to the device under test;

a current measurement unit which measures a quiescent power supply current for each test vector;

a fifth array data creating unit which creates fifth array data including the identifiers for the test vectors and the quiescent power supply current values thus measured as elements;

a sixth array data creating unit which sorts the fifth array data using the identifiers for the test vectors as a key so as to satisfy a first rule thereby creates sixth array data;

a seventh array data creating unit which calculates the difference in quiescent power supply current, which is obtained by calculating the differences between the adjacent quiescent power supply current elements of the sixth array data, so as to create seventh array data including the identifiers for the test vectors and the differences in current value as elements;

an eighth array data creating unit which sorts the seventh array data using the identifiers for the test vectors as a key so as to satisfy a second rule thereby creates eighth array data and an evaluation unit which assesses the quality of the device under test based upon the eighth array data, wherein the evaluation unit corrects the eighth array data according to a predetermined rule, and makes quality evaluation based upon the array data thus corrected.

19. A test system including a plurality of test apparatuses according to claim 18, wherein the test apparatuses are networked.

20. A test apparatus which measures a quiescent power supply current in a quality evaluation target device under test, and assesses the quality of the device under test, including:

a test vector setting unit which switches a plurality of test vectors, and supplies a test signal that corresponds to each test vector to the device under test;

a current measurement unit which measures a quiescent power supply current for each test vector;

a fifth array data creating unit which creates fifth array data including the identifiers for the test vectors and the quiescent power supply current values thus measured as elements;

a sixth array data creating unit which sorts the fifth array data using the identifiers for the test vectors as a key so as to satisfy a first rule thereby creates sixth array data;

a seventh array data creating unit which calculates the difference in quiescent power supply current, which is obtained by calculating the differences between the adjacent quiescent power supply current elements of the sixth array data, so as to create seventh array data including the identifiers for the test vectors and the differences in current value as elements;

an eighth array data creating unit which sorts the seventh array data using the identifiers for the test vectors as a key so as to satisfy a second rule thereby creates eighth array data; and an evaluation unit which assesses the quality of the device under test based upon the eighth array data, wherein the sixth array data creating unit corrects the sixth array data according to a predetermined rule, and wherein the seventh array data creating unit creates the seventh array data based upon the sixth array data thus corrected.

21. A test apparatus which measures a quiescent power supply current in a quality evaluation target device under test, and assesses the quality of the device under test, including:

a test vector setting unit which switches a plurality of test vectors, and supplies a test signal that corresponds to each test vector to the device under test;

a current measurement unit which measures a quiescent power supply current for each test vector;

a fifth array data creating unit which creates fifth array data including the identifiers for the test vectors and the quiescent power supply current values thus measured as elements;

a sixth array data creating unit which sorts the fifth array data using the identifiers for the test vectors as a key so as to satisfy a first rule thereby creates sixth array data;

a seventh array data creating unit which calculates the difference in quiescent power supply current, which is obtained by calculating the differences between the adjacent quiescent power supply current elements of the sixth array data, so as to create seventh array data including the identifiers for the test vectors and the differences in current value as elements;

an eighth array data creating unit which sorts the seventh array data using the identifiers for the test vectors as a key so as to satisfy a second rule thereby creates eighth array data; and an evaluation unit which assesses the quality of the device under test based upon the eighth array data, wherein, before the test of the quality evaluation target device under test, the current measurement unit measures a quiescent power supply current in increments of switched test vectors, for each of multiple samples of the device under test, and wherein the test apparatus further includes:

a first array data creating unit which performs statistical processing on the quiescent power supply current values measured for each of the multiple samples, and creates first array data including the identifiers for the test vectors and statistical quiescent power supply current values as elements;

a second array data creating unit which sorts the first array data using the statistical quiescent power supply current value as a key so as to create second array data; and a first rule creating unit which sets the order of the identifiers for the test vectors included in the second array data as the first rule.

22. A test apparatus according to claim 21, further including:

a third array data creating unit which calculates the difference in statistical quiescent power supply current, which is obtained by calculating the differences between the adjacent statistical quiescent power supply current elements of the second array data, so as to create third array data including the identifiers for the test vectors and the differences in current value as elements;

a fourth array data creating unit which sorts the third array data using the difference in current value as a key so as to create fourth array data; and a second rule creating unit which sets the order of the identifiers for the test vectors included in the fourth array data as the second rule.

* * * * *